United States Patent
Raaijmakers

[11] Patent Number: 6,108,937
[45] Date of Patent: Aug. 29, 2000

[54] METHOD OF COOLING WAFERS

[75] Inventor: Ivo Raaijmakers, Phoenix, Ariz.

[73] Assignee: ASM America, Inc., Phoenix, Ariz.

[21] Appl. No.: 09/150,986

[22] Filed: Sep. 10, 1998

[51] Int. Cl.[7] .................................................. F26B 7/00
[52] U.S. Cl. ................................ 34/433; 34/448; 34/508
[58] Field of Search ............................... 34/428, 433, 62, 34/391, 393, 380, 508, 448

[56] References Cited

U.S. PATENT DOCUMENTS

| | | | |
|---|---|---|---|
| 3,322,577 | 5/1967 | Smith, Jr. . | |
| 3,656,454 | 4/1972 | Schrader . | |
| 4,458,427 | 7/1984 | Akeret | 34/23 |
| 4,566,726 | 1/1986 | Correnti et al. | 294/64.3 |
| 4,717,645 | 1/1988 | Kato et al. . | |
| 4,811,493 | 3/1989 | Burgio, Jr. | 34/4 |
| 4,868,996 | 9/1989 | Ohmori et al. | 34/13 |
| 4,949,783 | 8/1990 | Lakios et al. . | |
| 5,033,407 | 7/1991 | Mizuno et al. . | |
| 5,080,549 | 1/1992 | Goodwin et al. | 414/744.8 |
| 5,181,556 | 1/1993 | Hughes . | |
| 5,248,370 | 9/1993 | Tsui et al. . | |
| 5,259,883 | 11/1993 | Yamabe et al. . | |
| 5,318,801 | 6/1994 | Snail et al. | 427/248.1 |
| 5,372,648 | 12/1994 | Yamamoto et al. . | |
| 5,443,997 | 8/1995 | Tsui et al. . | |
| 5,447,409 | 9/1995 | Grunes et al. . | |
| 5,447,431 | 9/1995 | Muka | 432/4 |
| 5,520,538 | 5/1996 | Muka | 432/205 |
| 5,520,742 | 5/1996 | Ohkase . | |
| 5,607,009 | 3/1997 | Turner et al. . | |
| 5,628,121 | 5/1997 | Brooks et al. | 34/61 |
| 5,778,968 | 7/1998 | Hendrickson et al. | 165/80.1 |
| 5,855,681 | 1/1999 | Maydan et al. | 118/719 |
| 5,882,413 | 3/1999 | Beaulieu et al. . | |
| 5,893,950 | 4/1999 | Martinoni et al. | 118/66 |
| 5,937,541 | 8/1999 | Weigand et al. | 34/565 |
| 5,970,717 | 10/1999 | Tateyama | 64/3.2 |
| 5,974,682 | 11/1999 | Akimoto | 34/66 |
| 6,000,227 | 12/1999 | Kroeker | 62/62 |

FOREIGN PATENT DOCUMENTS

| | | |
|---|---|---|
| 62-282437 | 8/1987 | Japan . |
| 03138369 | 6/1991 | Japan . |
| 03224236 | 10/1991 | Japan . |
| 07045536 | 2/1995 | Japan . |
| WO 93 26038 | 12/1993 | WIPO . |
| WO 94 14185 | 6/1994 | WIPO . |

Primary Examiner—Denise L. Ferensic
Assistant Examiner—Andrea M. Joyce
Attorney, Agent, or Firm—Knobbe, Martens, Olson & Bear, LLP

[57] ABSTRACT

Methods and apparatuses are provided for cooling semiconductor substrates prior to handling. In one embodiment, a substrate and support structure combination is lifted after high temperature processing to a cold wall of a thermal processing chamber, which acts as a heat sink. Conductive heat transfer across a small gap from the substrate to the heat sink speeds wafer cooling prior to handling the wafer (e.g., with a robot). In another embodiment, a separate plate is kept cool within a pocket during processing, and is moved close to the substrate and support after processing. In yet another embodiment, a cooling station between a processing chamber and a storage cassette includes two movable cold plates, which are movable to positions closely spaced on either side of the wafer.

38 Claims, 5 Drawing Sheets

COOL DOWN POSITION

PROCESS POSITION

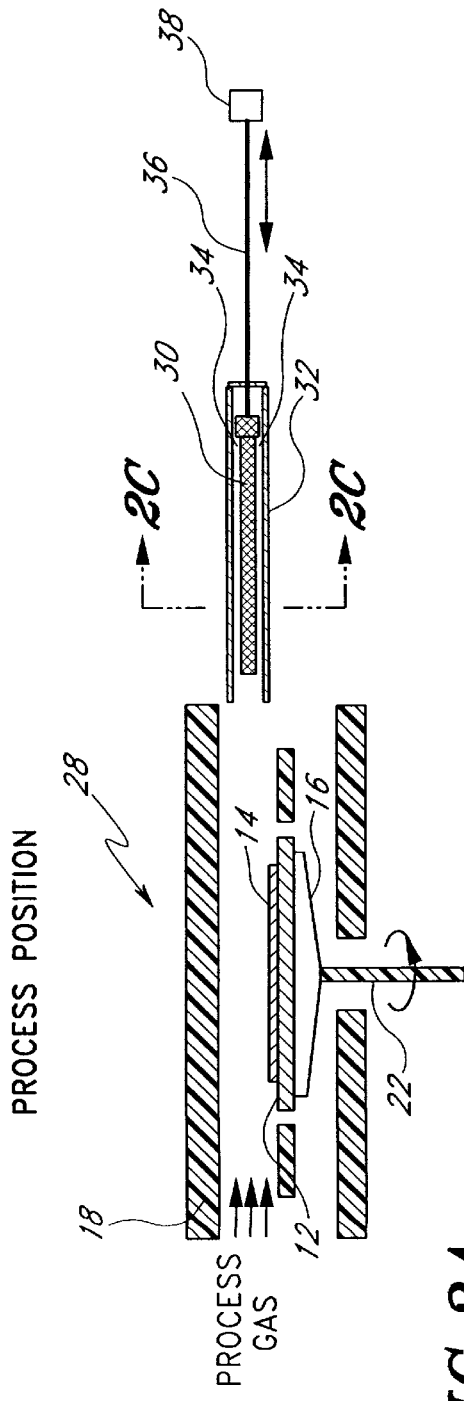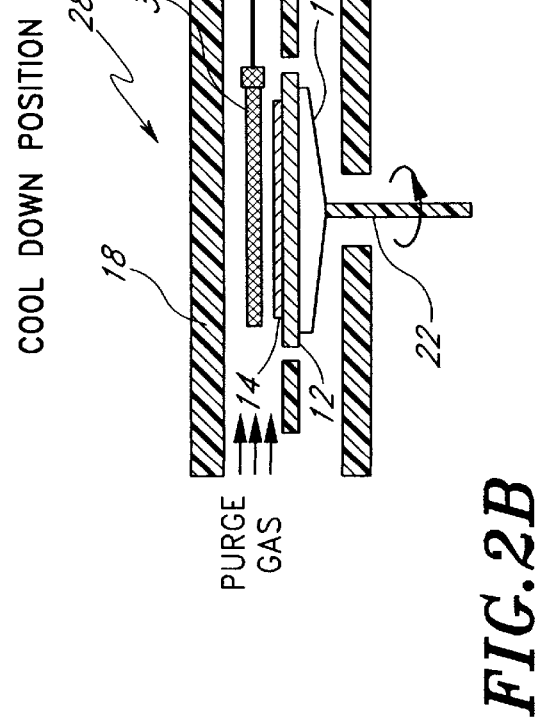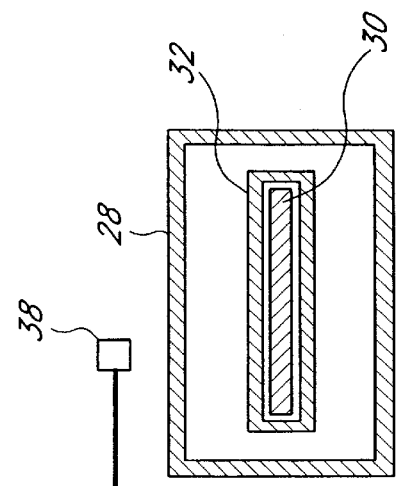

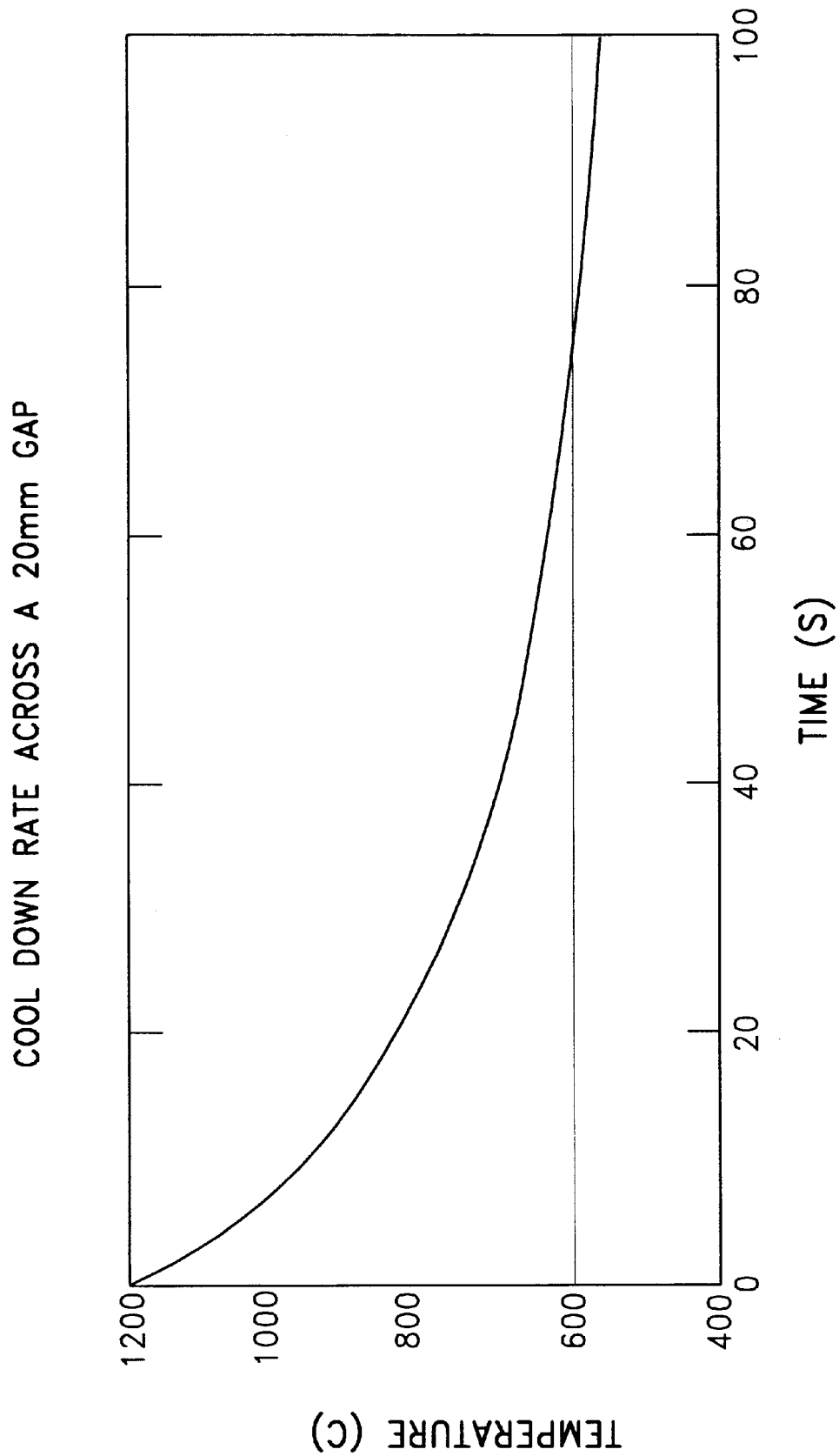

METHOD OF COOLING WAFERS

BACKGROUND OF THE INVENTION

This invention relates to methods and devices for cooling bodies such as semiconductor substrates after they are heated. More particularly, the invention relates to cooling a substrate by heat transfer between the substrate and a heat sink prior to handling the substrate.

Semiconductor wafers or other such substrates are subjected to very high treatment or processing temperatures. For example, in certain chemical vapor deposition (CVD) processes, the temperatures can approach 1,200° C. In a typical cycle, a wafer is transferred from a room temperature cassette by a robotic wafer handler into a processing or reaction chamber, where it is subjected to a high temperature treatment and is then transferred by the wafer handler from the high temperature processing chamber back to the same cassette or a separate cassette for processed wafers.

In many high temperature processes encountered in semiconductor processing, the wafer has to cool from the processing temperature to a much lower temperature before it can be placed or picked up by a wafer handler. For example, in an epitaxial silicon deposition reactor, processing temperatures in the reaction chamber are typically in the range of 1,000–1,200° C., while the maximum temperature that the robotic wafer handler can handle is only about 900° C. Furthermore, at high temperatures, the wafer is more vulnerable to physical damage which can be caused by the wafer handler during transportation. Therefore, the wafer must be allowed to cool down from the processing temperature (e.g., to about 900° C.) before it can be handled and transferred by standard handling equipment. Similarly, the wafer must be cooled down to even lower temperatures for safe handling by other types of wafer handlers (e.g., paddles), and for storage in low cost cassettes.

The time required to cool down the wafer to handling temperatures can be very costly to the integrated circuit manufacturer. Cool down rates depend in part upon the mass of the system being cooled, and have been measured at about 45 seconds from 1,200° C. to 900° C. for a 200 mm wafer on typical susceptor. This cool down adds to the total cycle time for each wafer and hence decreases the throughput of the system. This will increase the cost of wafer processing.

Because of the high cost of semiconductor wafer processing equipment, it is critically important from a competitive standpoint to be able to keep the expensive equipment in continued use, allowing increased throughput. At the same time, the wafer cooling technique employed must be compatible with the environment of the CVD processing apparatus and stringent purity requirements. Additionally, the cost of the technique must itself be low enough that there is a net reduction in the per-wafer cost of processing.

It is therefore an object of the present invention to provide a method and apparatus to cool down a wafer quickly and in a uniform fashion from a high processing temperature to a temperature at which the wafer can be picked up using a wafer handler and placed in wafer storage cassette.

SUMMARY OF THE INVENTION

In accordance with one aspect of the present invention, a method is provided for treating substrates in a processing chamber. The method includes loading a substrate onto a support structure within the chamber. The substrate is heated to a treatment temperature and treated at that temperature. After the substrate has been treated, an element is moved within the chamber to bring the substrate and a cooling surface of a heat sink into a cooling position. The substrate and cooling surface are maintained at the cooling position, in which the substrate loses heat to the cooling surface.

In accordance with another aspect of the present invention, a method is provided for cooling a substrate after heating to a processing temperature. The method includes moving the substrate from a first position to a second position in proximity to a cold element. The substrate is maintained at the second position while heat transfers from the substrate to the cold element until it cools to a handling temperature which is lower than the processing temperature.

In accordance with another aspect of the present invention, a method is provided for cooling a semiconductor substrate from a first temperature to a second temperature. The method includes moving a cooling member from a retracted position to a location adjacent and spaced from the substrate. In the retracted position, the cooling member has a third temperature which is lower than the second temperature. The cooling member is maintain in the adjacent position until the substrate cools to the second temperature. The substrate is then lifted with substrate handling device.

In accordance with still another aspect of the present invention, a processing reactor is provided for treating substrates at high temperatures. The reactor includes a heat source and a plurality of walls which define a process chamber. A substrate support structure is housed within the chamber. The reactor further includes a heat sink and a movable element. A drive mechanism moves the movable element from a first position to a second position. In the first position, a substrate (supported by the support structure within the chamber) can be treated. In the second position, the heat sink is spaced from the substrate by a distance sufficiently small to enable heat transport between the cold element and the substrate.

In accordance with yet another aspect of the present invention, a substrate processing system is provided with a high temperature processing chamber, a substrate holder positioned within the chamber, a cooling member, and a cooling shelter. The shelter is configured to shield the cooling member from heat during high temperature processing. A moveable arm, supporting the cooling member, is connected to a drive mechanism which can extend the moveable arm and cooling member from a first position to a second position. In the first position, the cooling member is proximate the cooling shelter, while in the second position, the cooling member is proximate the substrate holder.

In accordance with another aspect of the invention, a cooling mechanism is provided in a substrate processing system. The mechanism includes a support structure configured to support a substrate, a first cooling element and a second cooling element. These components are relatively movable between a cooling position and a substrate load position. In the cooling position, the substrate is proximate and spaced between each of the first and second cooling elements. In the substrate load position, a wafer handler can place the substrate upon the support structure.

Advantageously, the illustrated embodiments facilitate conductively cooling a substrate, thus cooling the substrate significantly faster than by radiation alone. As the cooling methods and mechanisms do not require handling the substrate with a pick-up device, down time (specifically that caused by waiting for substrate to reach a temperature at which it can be safely handled) is significantly reduced. Additionally, the substrate can be cooled before moving it from the support structure within the process chamber, in accordance with certain of the above-noted aspects. Few moving parts are required to adapt the invention to existing reactors designs. The faster cool down process will allow a wafer or other substrate to be picked up from or placed on a susceptor in a shorter time, which enhances wafer throughput and ultimately decreases cost of wafer processing.

BRIEF DESCRIPTION OF THE DRAWINGS

FIG. 2A is a schematic cross-sectional view of a processing chamber constructed in accordance with another embodiment of the present invention, with the chamber in a processing mode.

FIG. 2B illustrates the processing chamber of FIG. 2A, with the chamber in a cooling mode.

FIG. 2C is a schematic cross-section taken along lines 2C—2C. of FIG. 2A.

FIG. 3A is a graph plotting temperature against cooling time for a spacing of about 20 mm between a wafer surface and a cooling surface.

DETAILED DESCRIPTION OF THE PREFERRED EMBODIMENTS

While the invention is illustrated in the context of a single-wafer, horizontal gas flow reactor, it will be understood by one of ordinary skill in the art that the cooling mechanism of the present invention is not limited to any specific type of reactors or processing chambers. Rather, the skilled artisan will find application for the principles disclosed herein in connection with a number of different types of processing chambers or reactors, including cluster tools, batch processing systems, vertical gas flow or showerhead systems, etc. Furthermore, while the applications have particular utility for cooling down wafers before handling and removing the wafer from the process chamber, the principles disclosed herein have application whenever it is desirable to cool a workpiece prior to handling or storage.

Figure 1B:
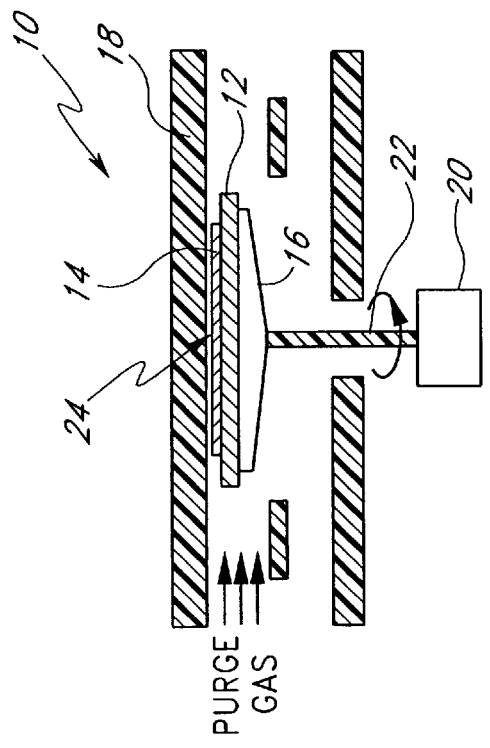
FIG. 1B illustrates the processing chamber of FIG. 1A, with the wafer in a cooling position.
Figure 1A:
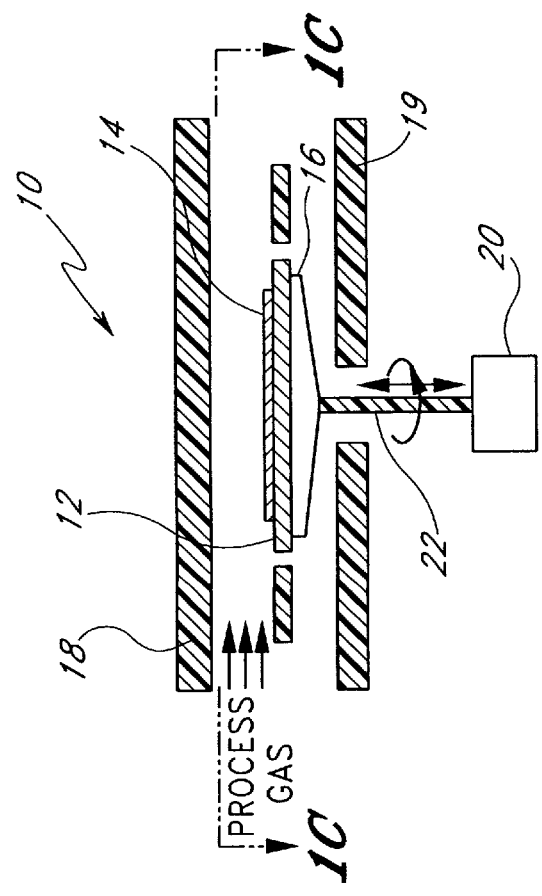
FIG. 1A is a schematic cross-sectional view of a processing chamber constructed in accordance with a first embodiment of the present invention, with the wafer in a processing position.
Figure 1C:
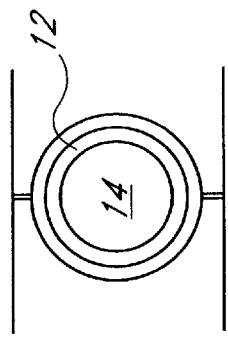
FIG. 1C is a schematic cross-sectional view taken along lines 1C—1C of FIG. 1A.

FIGS. 1A, 1B and 1C illustrate a processing chamber which incorporates a cooling system constructed in accordance with a first preferred embodiment of the present invention. A portion of a processing chamber 10 containing the cooling mechanism is shown. A wafer support structure includes a susceptor 12 directly supporting a semiconductor wafer 14 or other processing substrate or workpiece (e.g., glass substrate). The susceptor 12, in turn, is supported by a spider 16 on at least three points. The illustrated susceptor 12 is disk-shaped, with a diameter larger than that of the wafer 14, and the wafer 14 is placed concentrically on the susceptor 16. An external drive mechanism or motor 20 rotates a shaft 22, which extends through the bottom wall 19 of the chamber 10. The shaft 22, in turn, supports and drives the rotation of the spider 16, susceptor 12 and wafer 14.

The illustrated chamber 10 is defined by an upper wall 18 and a lower wall 19, typically comprising quartz, which are substantially transparent to energy from radiant heat sources or lamps (not shown) outside the chamber 10. As the walls 18, 19 do not appreciably absorb the radiant heat from the lamps while the susceptor/wafer combination does absorb this heat, the chamber is conventionally referred to as a "cold wall" chamber. Forced fluid (e.g., forced air and/or circulated liquid coolant) actively cool the walls 18, 19 by convection, aiding to keep the walls 18,19 cooler than the susceptor 12 or wafer 14 housed within the chamber 10.

The shaft 22 can also be translated vertically. It will be understood that the vertical translation can be accomplished by the same motor 20 which drives the rotation, or can be driven by a separate motor. It will be further understood by one of skill in the art that whole shaft can be elevated, or a telescoping portion of the shaft can lift the spider 16, susceptor 12 and wafer 14. Alternatively, the shaft can extend through the spider and lift the susceptor directly. During lifting, the wafer 14 remains directly supported by the same susceptor 12 (or other wafer support structure) which supports the wafer during processing.

With reference to FIG. 1B, in operation, after the wafer 14 has been treated at high temperature and needs to be cooled down prior to handling, the wafer 14 is lifted until it is in a cooling position proximate the upper wall 18 of the reactor or processing chamber 10. Preferably, the upper wall 18 has a flat inner surface substantially parallel with a wafer surface when the wafer 14 is in the cooling position, forming a gap 24 as shown in FIG. 1b. As the upper wall 18 is cooler than the just-treated wafer 14, the wall 18 serves as a heat sink. In the illustrated embodiment, the wafer surface facing the cooling surface of the cold wall 18 is the same surface which was treated during processing, due to the fact that the susceptor 12 continues to support the wafer 14 while it is cooled.

The upper surface of the wafer 14 is brought close enough to the inner surface of the upper wall 18 that conductive heat transfer between the two contributes significantly to, and preferably dominates, the total heat transfer. At high pressures, viscous flow is prevalent and the heat conductance of gases is independent of pressure. It is well known that the heat transfer rate of radiation depends upon the temperature difference between two objects, while the heat transfer rate of conduction is determined by both the temperature difference and the distance between the objects. In the illustrated embodiment, in addition to radiative heat transfer, heat is efficiently conducted through the ambient gas (e.g., purge gas) across the gap 24.

Figure 3B:
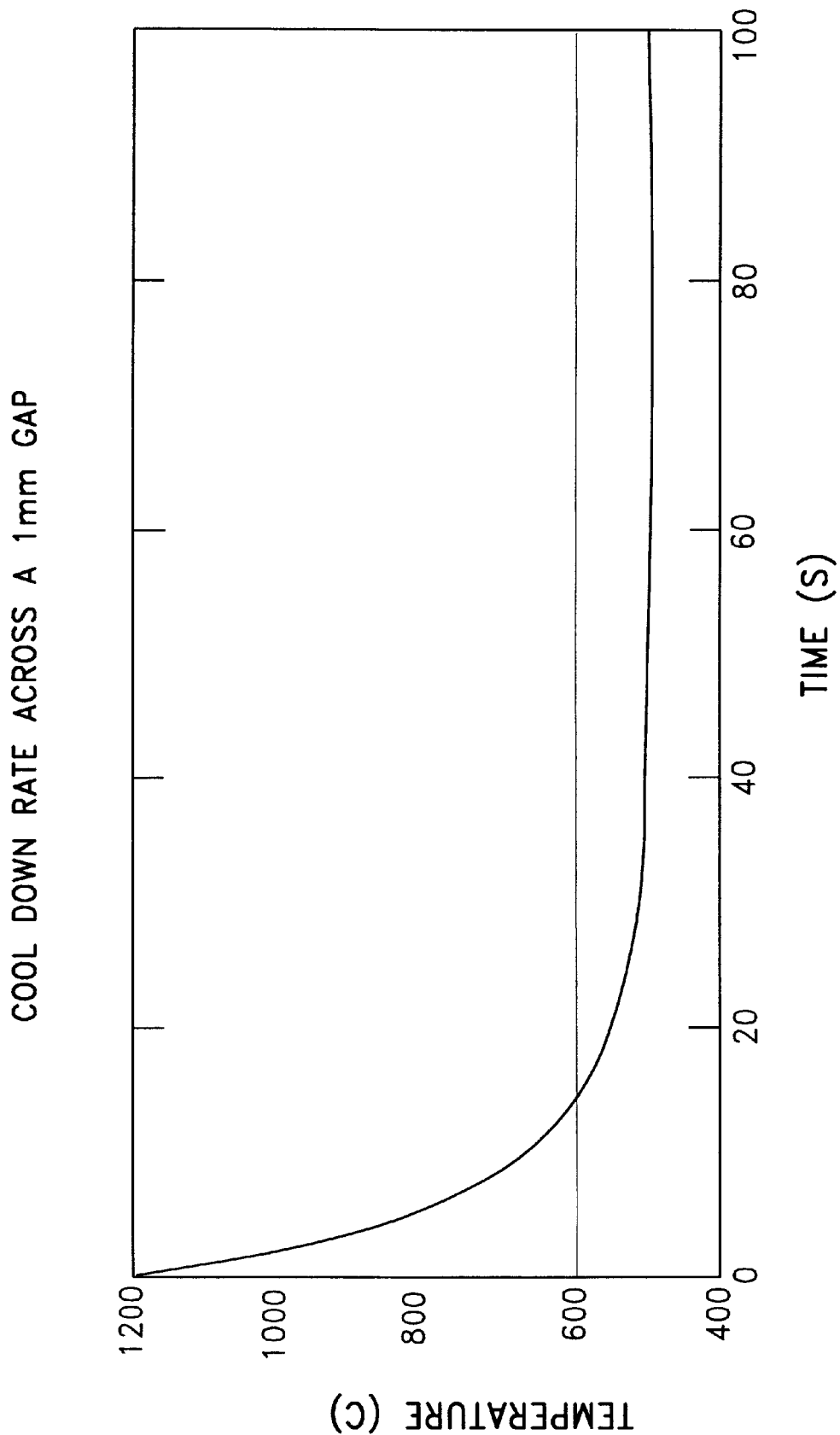
FIG. 3B is a graph plotting temperature against cooling time for a spacing of about 1 mm between a wafer surface and a cooling surface.

It has been found that, under normal operating conditions of illustrated reaction chamber 10, conductive heat transfer contributes significantly to the heat transfer when the gap 24 is less than about 5 mm. Preferably the gap 24 is between about 0.2 mm and 3.0 mm, and more preferably between about 0.5 mm and 1.5 mm. For example, with a gap of 1 mm, the dominant heat transport mechanism is heat conduction through the gas phase. Thus the wafer/susceptor combination will cool down much faster when proximate the cold wall than it does by radiation alone (e.g., when the gap 24 is larger than 20 mm). The cooling rates at a gap of 1 mm and a gap of 20 mm are given in FIGS. 3A and 3B, respectively, which are discussed in more detail below.

Uniformity of the gap 24 and uniform temperatures across across the cold wall facilitate uniform heat transfer across the surfaces. Accordingly, the stresses of thermal non-uniformities and consequent warpage or other damage to the wafer 14 are avoided. Uniform heat transfer can be further enhanced by continuing to rotate the wafer 14 while cooling the wafer 14, as shown in FIG. 1B.

After the wafer 14 cools sufficiently for pick-up device to safely handle it without damaging either the wafer or the pick-up device, the wafer 14 is lowered to a position at which it can be picked up. A preferred pick-up device is illustrated in U.S. Pat. No. 4,846,102, which describes a pick-up wand which operates on the Bernoulli principle, shooting high velocity streams of gas at angles. When brought close to the top of a wafer surface, the gas streams create a low pressure zone above the wafer, causing the wafer to lift. The disclosure of U.S. Pat. No. 4,846,102 is hereby incorporated by reference. This wand, which shall be referred to as a "Bernoulli wand" herein, can safely pick up wafers at temperatures of about 900° C. or lower.

As noted, the same structure which directly supports the wafer 14 during processing (namely, the susceptor 12) supports the wafer 14 as it is moved into the cooling position. Accordingly, cooling of the wafer 14 can be hastened without the need for a special high-temperature handling device. Moreover, no additional transfer step is required, and risk of dropping, scratching or otherwise damaging the wafer while it is still hot is minimized.

The above-described embodiment also enables rapid cooling without increasing the risk of particulate contamination of the chamber and the wafer. In the first place, since the cooling is conducted within the process chamber, movement is minimized. Secondly, while the upper wall 18 is convectively cooled through forced air and/or circulated liquid coolant, the wafer cooling is predominantly conductive. Accordingly, the increased rate of wafer cooling is not accompanied by exposing the wafer to increased forced air convection. Predominantly convective cooling methods, in contrast, can achieve rapid cooling only at expense of increased particulate contamination of the wafer.

FIGS. 2A, 2B, and 2C. illustrate a processing chamber 28 constructed in accordance with a second embodiment of the invention. For convenience, elements similar to those in FIG. 1 will be referred to by like reference numerals. As illustrated, the chamber 28 includes a cooling member or plate 30, preferably stored within a pocket 32 outside the processing area, such that the plate 30 does not interfere with wafer processing. In the illustrated embodiment, the pocket 32 is located at the downstream end of the chamber 28, opposite the processing gas inlet and wafer loading port. As shown in FIG. 2A, the plate 30 is mounted within the pocket 32, spaced from the surfaces of the pocket 32 by distances or spacings 34, on a movable arm 36. The arm 36 extends through the pocket 32 and is driven by a drive mechanism or actuator 38.

The illustrated plate 30 has a flat lower surface which is greater than or equal to the surface area of the wafer 14, and preferably comprises a material with a specific heat capacity higher than that of wafer 14 or susceptor 12. The thickness of movable plate 30 can be selected by the skilled artisan to balance the material costs and available space with advantageously high total heat capacity. Desirably, the plate 30 has a thermal mass greater than that of the wafer 14 to be processed. The thermal mass of a solid, or its lumped thermal capacitance, is given by the equation:

$$C_T = \rho V c$$

where:
    ρ=the density of the solid,
    V=the volume of the solid, and
    c=the specific heat (heat capacity) of the solid. Thus, for a given material and surface area, the thermal mass of the plate 30 is directly related to its thickness.

As the pocket 32 is located outside the processing area, it is sheltered from and does not absorb the radiant heat directed at the wafer/susceptor combination, and thus remains relatively cooler than the wafer 14. Advantageously, surfaces defining the pocket 32 are actively cooled by convection, such as by a circulated coolant fluid (air or water).

In operation, the plate 30 is kept in the pocket 32 while the wafer 14 is subjected to high temperature treatment (e.g., epitaxial deposition at about 1,000° C. to 1,200° C.). The cooled pocket 32 keeps the plate 30 cooler, preferably below the handling temperature (e.g., about 900° C. for the preferred Bernoulli wand). Desirably, the spacings 34 between the surfaces of the plate 30 and the walls of the pocket 32 are less than about 5 mm, so that conductive heat transfer contributes to the heat exchange which keeps the plate 30 cool within the cooled pocket 32. Depending upon the ambient gas pressure and conductivity within the chamber 10, the spacing is preferably between about 0.2 m and 3 mm, and more preferably between about 0.5 mm and 1.5 mm. Desirably, the wafer 14 continues to rotate during the cooling process.

When the high temperature processing step is completed, the actuator 38 drives the arm 36 to move the plate 30 over the wafer 14, such that the plate 30 is proximate the wafer 14. In the illustrated embodiment, plate 30 is mounted parallel to the wafer 14 and in the appropriate vertical position relative to the wafer (i.e., preferably vertically spaced by less than about 3 mm, more preferably between about 0.5 mm and 1.5 mm). Accordingly, the preferred actuator 38 moves the arm 36 and thus the plate 30 exclusively horizontally. It will be understood that, in other arrangements, the plate 30 can be moved both horizontally and vertically until it is in face-to-face relation, spaced from the wafer by a distance facilitating conductive heat transfer.

The vertical gap 24 between facing surfaces of the wafer 14 and the plate 30 is preferably as described with respect to the embodiment of FIG. 1. Accordingly, the wafer/susceptor combination cools quickly by both conductive and radiative heat transfer.

When the wafer 14 is cooled to the desired handling temperature (e.g., about 900° C. for the preferred pick-up wand), the movable plate 30 is moved back to the pocket 32. The heat absorbed from the wafer/susceptor during the cooling is then absorbed by the actively cooled pocket 32, to return to its original idle temperature. In the interim, the wafer handler can pick up the wafer 14.

As with the first embodiment, the second embodiment facilitates cooling the wafer 14 without requiring separate handling of the wafer 14. Accordingly, no special high temperature handler is necessitated. Furthermore, the mechanism of the second embodiment can be adapted to cool wafers within so-called "hot wall" chambers, as long as the moveable plate is maintained at a lower temperature than the handling temperature. While, in other arrangements, the plate itself can be directly cooled, the illustrated arrangement advantageously obviates plumbing or other coolant communication through the movable arm.

In either of the above-described embodiments, the cooling rate is preferably enhanced by introducing purge gas to the processing chamber during the cooling step, as is known in the art. Any purge gases conventionally used in this type of reactor and process can be used in the present invention. Examples of suitable purge gases include argon, hydrogen, nitrogen, and helium. Most preferably, the purge gas is one with a high heat conductivity, such as helium and hydrogen. Such purge gas can serve as a heat conduction medium between the substrate and the cooling element.

It will be recognized by the skilled artisan that other cooling methods can also be employed within the processing chamber, in combination with the illustrated mechanisms, thereby minimizing cool down times.

The cooling rate can be estimated by the following equation:

$$\frac{\delta T}{\delta t} = \frac{1}{C_p} \cdot \left[ -\frac{\lambda(T)}{d} \cdot (T - T_w) - \frac{\sigma \cdot (T^4 - T_w^4)}{\left(\frac{1}{\varepsilon} + \frac{1}{\varepsilon_w} - 1\right)} \right]$$

The meanings of the symbols in the equation are given in the following Table. Also given in the Table are the parameters defining initial cooling conditions. The cooling rates of the susceptor 12 and the wafer 14 calculated from this equation using the parameters are plotted in FIGS. 3A and 3B, respectively. The only difference between these two cases is that the gap 24 (represented by d distance in the equation) is 20 mm in the case shown in FIG. 3A, while the gap 24 is 1 mm in the case shown in FIG. 3B.

TABLE

COOL DOWN RATE

| Constant or Variable | Definition | Units | Value |
|---|---|---|---|
| $C_p$ | heat capacity per unit area for the susceptor/wafer combination | J/m²K | 4620 |
| $\varepsilon$ | susceptor emissivity | | 0.7 |
| $\lambda(T)$ | heat conductivity of gas | W/mK | $-(0.5411 \times 10^{-8}) \times T^2$ $+ (4.457 \times 10^{-4}) \times T$ $+ (6.866 \times 10^{-2})$ (for $H_2$) |
| $T_s$ | starting temperature | K | 1473 |
| $T_w$ | wall temperature | K | 773 |
| d | gap size | m | $20 \times 10^{-3}$ (FIG. 3A) $1 \times 10^{-3}$ (FIG. 3B) |
| $\varepsilon_w$ | wall emissivity | | 0.7 |
| $\sigma$ | Stefan Boltzmann Constant | W/m²K⁴ | $5.6 \times 10^{-8}$ |

Preferably, the cooling step takes less than about 60 seconds, and more preferably less than 10 seconds to cool a wafer/susceptor combination from 1,000° C.–1,200° C. to less than or equal to about 900° C. It can be seen from FIGS. 3A and 3B that it takes about 17 seconds to cool the wafer 14 from 1,200° C. to 900° C. when the gap 24 is 20 mm (see FIG. 3A), while it takes only about 4 seconds when the gap 24 is 1 mm (see FIG. 3B). This calculation shows a significant difference in cooling rate caused by reducing the distance between the cold wall and the wafer surface. When it is cooled to a lower temperature, the difference becomes even bigger, as heat transfer by radiation is less dominant at these lower temperatures.

The above-noted calculations are given for a wafer and susceptor combination, and particularly for a silicon carbide susceptor with a thickness of about 0.7 mm and 200 mm wafer with a similar thickness. It will be understood, however, that similar calculations can be performed for cooling the wafer alone, or for cooling the susceptor alone. For example, if it is desired to cool a susceptor after a process in which no wafer is involved (e.g., chamber/susceptor etch process for cleaning between wafer processing steps), the susceptor alone can be brought in proximity to the chamber cold wall, or a heat sink can be brought in proximity to the susceptor.

The shorter the cooling period in the processing chamber 10, the sooner the wafer can be removed and another wafer fed into the processing chamber 10 for continued production. Thus, in one implementation, the wafer 14 is removed from the processing chamber 10 when it is cooled from a processing temperature of 1,000° C.–1,200° C. down to about 900° C. In another implementation, the wafer 14 is removed from the process chamber with a more sensitive wafer handler after processing at greater than 600° C. down to a handling temperature below 600° C. The wafer can then be further cooled down to a temperature at which it can be stored in a cassette. For example, the wafer can be maintained on a wafer handling device or at some off-line location until it cools to about 100° C. See the description below of FIGS. 4A and 4B.

As will be readily apparent to the skilled artisan, the cooling mechanisms and methods disclosed herein can be adapted to any suitable conventional processing chambers. For example, the rotatable substrate supporting mechanism disclosed in U.S. Pat. No. 4,821,674, which is incorporated herein by reference, can be used in the present invention for supporting and controlling the movement of the wafer/susceptor. Similarly, the cooling mechanism of the present invention can be readily adapted to a reaction chamber of the type disclosed in U.S. Pat. No. 5,020,475, the disclosure of which is also incorporated herein by reference. The skilled artisan will recognize that a variety of methods for cooling a wafer substrate outside the processing chamber can be used in combination with the above-described precooling processes and apparatuses for use inside the processing chamber.

Figure 4B:
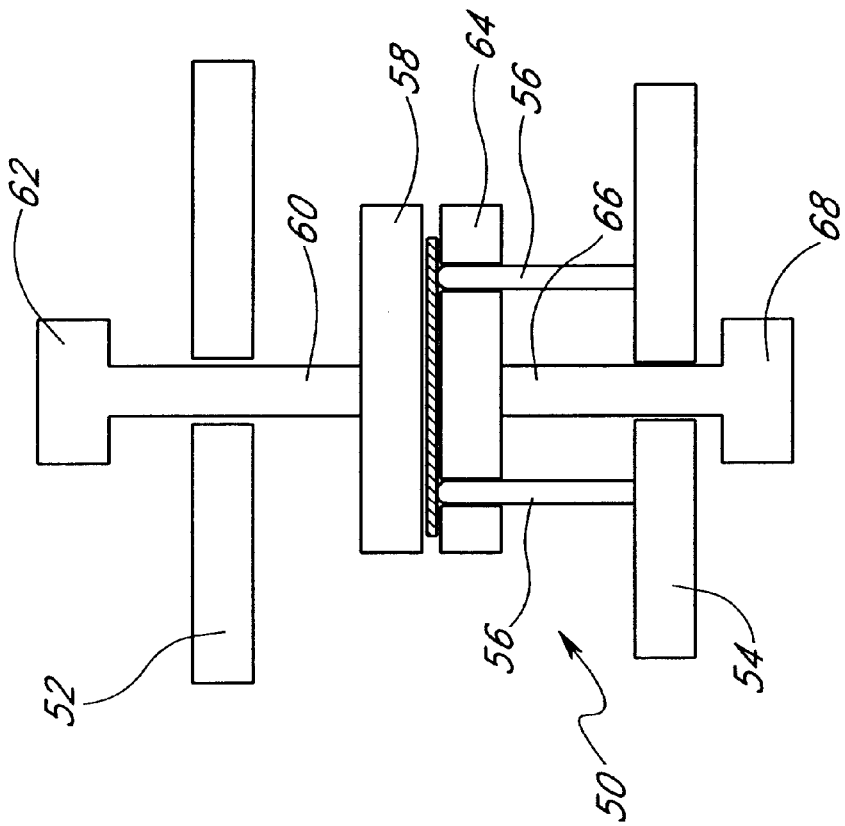
FIG. 4B illustrates the cooling station of FIG. 4A in a substrate cooling position.
Figure 4A:
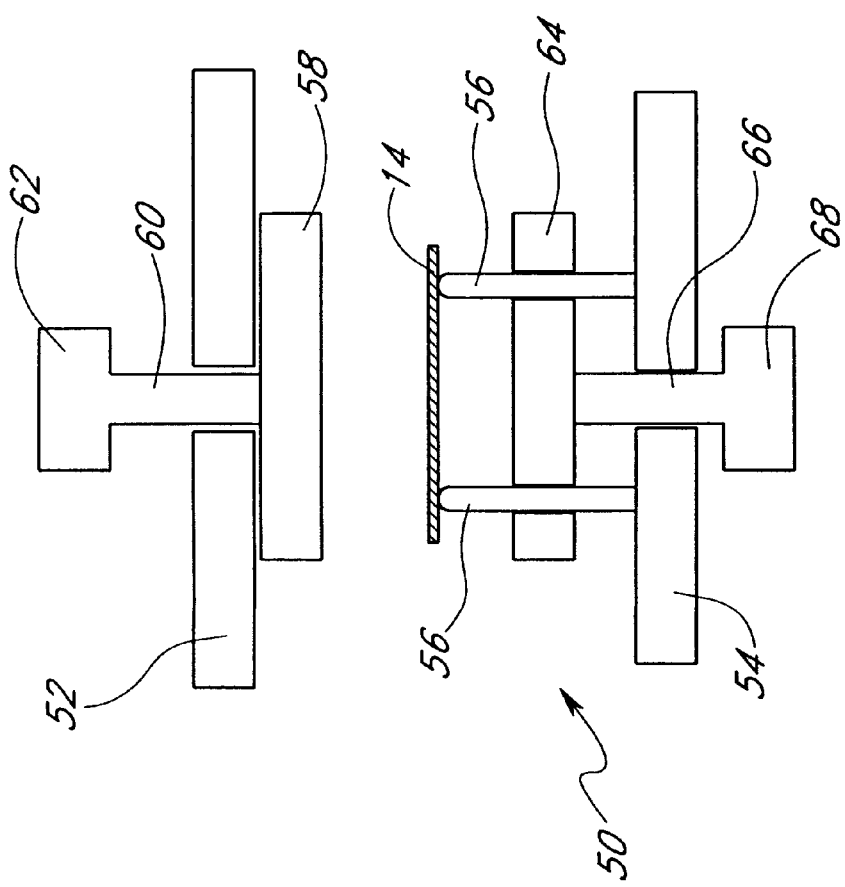
FIG. 4A is a schematic cross-sectional view of a cooling station constructed in accordance with a third embodiment of the present invention, with the station in a substrate load/unload position.

Moreover, as demonstrated by the embodiment of FIGS. 4A and 4B, the methods and structures disclosed above can be adapted to non-processing chambers. FIG. 4A illustrates a cooling station 50 in a separate chamber outside of a processing chamber. For example, the illustrated structure could be employed in a wafer handling chamber between wafer transfer/storage cassettes and the processing chamber, or in a separate cooling chamber in a cluster tool. While cassettes are available that can handle wafers as hot as 170° C., they are relatively expensive. A commonly available less expensive one made of Delrin® can only handle temperatures well below 100° C. Other commonly available units can only handle about 60° C.

The illustrated cooling station is configured for use in conjunction with a handler which provides both a Bernoulli wand and a paddle. A complete description of such an arrangement is disclosed in U.S. patent application Ser. No. 08/784711 filed Jan. 16, 1997, which is incorporated herein by reference.

FIG. 4A shows the wafer 14 supported between an upper chamber wall 52 and lower chamber wall 54, where the station 50 is an a wafer load/unload mode. A wafer support structure defines a position at which the substrate is supported. In the illustrated embodiment, the wafer support structure comprises a plurality of support pins 56 (at least three) positioned to stably support the wafer 14 horizontally.

When first loaded onto the pins 56, the wafer 14 can be at any temperature higher than the desired handling or storage temperature. In an exemplary implementation, the wafer 14 is transported from a thermal processing chamber upon a high temperature handler. The initial wafer temperature thus ranges from about 200° C. to 1,500° C., depending upon the process to which it was previously subjected and the temperature tolerance of the high temperature wafer handler. In the illustrated embodiment, the initial wafer temperature is between about 600° C. and 1,200° C., and particularly about 900° C., transported by a wand operating on the Bernoulli principle.

Between the supported wafer 14 and the upper wall 52, a first or upper cooling member 58 is supported above the wafer 14. The upper cooling member 58 is shown movably supported by a piston 60 which extends upwardly through the upper chamber wall 52, where the piston 60 connects to a first or upper actuator 62. The cooling member 58 is preferably actively cooled between cooling steps, and more preferably is continually cooled while wafers are being processed through the system. For example, the piston 60 can include internal plumbing to circulate coolant which convectively cools the cooling member 58 in both the positions of FIG. 4A and the position of FIG. 4B, discussed below.

In the illustrated wafer load/unload position, the upper cooling member 58 is spaced sufficiently above the wafer to provide clearance for the preferred high temperature wafer handler to load or drop off the wafer 14 at the cooling station 50. It is advantageous to be able to use the high temperature wand because it does not touch the upper surface of the wafer and cools the wafer 14 convectively as the wafer 14 is transported.

In other arrangements, the upper cooling member can be moved to provide such clearance only in a wafer loading mode, while it can be kept proximate to the wafer in both substrate cooling (FIG. 4B) and wafer unloading modes. In still other arrangements, where both loading and unloading are performed by a wafer handler which supports the wafer solely from beneath the wafer (e.g., paddle or fork), such clearance need not be provided, and the upper cooling member can be fixed at a position proximate the upper wafer surface.

The cooling station 50 also includes a second or lower cooling member 64, supported between the wafer 14 and the lower chamber wall 54. In the illustrated embodiment, the lower cooling member 64 is movably supported by a post 66, shown extending through the lower wall 54 to a second or lower actuator 68. The lower cooling member 64 is desirably also actively cooled.

As with the upper member 58, the lower cooling member 64 is spaced below the wafer 14 to allow access by a wafer handler, particularly a paddle which is well adapted for moving a wafer into and out of a common cassette for wafers. Further, using the paddle for transporting a wafer between the cassette and the cooling station is desirable because it fits between wafers in a standard cassette. For example, a low temperature wafer handler for unloading the wafer from the station 50 can comprise a fork or paddle which extends beneath the wafer 14 among the pins 56. Once beneath the wafer 14, the handler lifts the wafer 14 only slightly to clear the pins 56, and transports the wafer 14 to a wafer storage cassette in a load lock chamber.

In other arrangements, the lower cooling member can be lowered to provide such clearance only in a wafer unloading mode, while it can be kept proximate to the wafer in both substrate cooling (FIG. 4B) and wafer loading modes. In still other arrangements, where both loading and unloading are performed by a wafer handler which supports the wafer solely from above the wafer (e.g, a handler operating on the Bernoulli principle), such clearance need not be provided, and the lower cooling member can be fixed at a position proximate the lower wafer surface.

With reference now to FIG. 4B, the cooling station 50 is illustrated in a substrate cooling position. As shown, the upper cooling member 58 is lowered to a position in proximity to the upper surface of the wafer 14, such as to allow heat transfer from the wafer to the cooling member 58. The gap between parallel surfaces of the upper cooling member 58 and the wafer 14 is thus less than about 5 mm, preferably between about 0.2 mm and 3 mm, and more preferably between about 0.5 mm and 1.5 mm.

Preferably, the lower cooling member 64 is also raised to a position proximate the lower surface of the wafer 14, such as to allow heat transfer from the wafer to the lower cooling member 64. The gap between the lower cooling member 64 and the wafer 14 is thus as described with respect to the upper cooling member 58.

Desirably, the cooling station 50 provides for conductive heat transfer from two opposite side of the wafer 14, thus rapidly cooling the wafer. As the cooling station 50 operates to cool the wafer 14 to lower temperatures than the previously described embodiments, this double conductive heat transfer is particularly advantageous, as radiative heat transfer is less dominant at lower temperatures. Desirably, the cooling station 50 is is maintained in the cooling position until the wafer 14 cools to a temperature which the handler and/or cassette can tolerate. Thus, the station 50 is preferably kept in the cooling position until the wafer 14 cools to less than about 170° C. prior to unloading the wafer 14 for storage in a high temperature cassette. In other arrangements, the wafer 14 is preferably cooled to less than about 100° C. or 60° C., depending upon the temperature sensitivity of the cassette being employed.

It will thus be appreciated that the substrate cooling systems described above have great flexibility and can be adapted to many different existing systems. The embodiments disclosed herein facilitate rapid cooling prior to handling the wafer. The wafer can thus be more quickly removed from the processing chamber so that the chamber is sooner free to process a second substrate. Similarly, substrate can be cooled to a cassette storage temperature more rapidly, such that cooling for storage is does not limit the rate at which substrates are passed through a processing system. The cooling of the wafer is greatly promoted by bringing the wafer surface proximate a heat sink, or vice versa, prior to handling the wafer. The heat sink can be a cold element of the reactor, or a separate cold element installed in the processing chamber for this purpose. The particular heat sink can be made any suitable shape in various embodiments. Advantageously, however, the cooling surface of the reactor wall or the plate is planar and substantially parallel to the treated surface of the wafer, and thus is face-to-face relation, when the system is in a cooling mode. In this manner, the wafer need not be removed from the wafer support structure for the precooling step.

The distance between the cooling surface and the wafer surface can be made as small as possible. Preferably, however, the wafer and cooling surfaces do not touch each other. For normal operation, the gap is preferably less than about 3 mm, more preferably between about 0.5 mm and 1.5 mm, and most preferably about 1.0 mm. The cooling can be conducted at any pressure, for example, at atmospheric pressure or under reduced pressure, as long as the pressure is in the viscous regime.

It will be appreciated by those skilled in the art that various modifications and changes may be made without departing from the scope of the invention. Such modifications and changes are intended to fall within the scope of the invention, as defined by the appended claims.

What is claimed is:

1. A method of treating substrates in a processing chamber, comprising:

loading a substrate onto a support structure within the processing chamber;

heating the substrate to at least one treatment temperature;

treating the substrate at the treatment temperature in a treatment position within the processing chamber;

after treating the substrate, moving an element to bring the substrate and a cooling surface of a heat sink into a cooling position within the processing chamber wherein the substrate loses heat to the cooling surface; and maintaining the substrate and the cooling surface in the cooling position.

2. The method of claim 1, wherein the substrate and the cooling surface are spaced by between about 0.2 mm and 3.0 mm in the cooling position.

3. The method of claim 1, wherein the substrate and the cooling surface are spaced by between about 0.5 and 1.5 mm in the cooling position.

4. The method of claim 1, further comprising removing the substrate from the support structure after maintaining the substrate and the cooling surface in the cooling position, removing the substrate from the chamber, and loading a second substrate onto the support structure.

5. The method of claim 1, wherein moving the element comprises moving the heat sink.

6. The method of claim 1, wherein the heat sink is actively cooled.

7. The method of claim 6, further comprising withdrawing the heat sink from the cooling position to an actively cooled location after maintaining the substrate and the cooling surface in the cooling position.

8. The method of claim 6, wherein the element comprises the support structure, and further comprising withdrawing the element from the cooling position prior to removing the substrate from the support structure.

9. The method of claim 1, wherein the heat sink comprises at least a portion of a wall of the processing chamber, and moving the element comprises moving the support structure.

10. The method of claim 1, wherein the heat sink comprises a cooling plate, and moving the element comprises moving the plate.

11. The method of claim 1, wherein the cooling surface is substantially parallel to a surface of the substrate in the cooling position.

12. The method of claim 1, further comprising providing a purge gas to the chamber while cooling the substrate.

13. The method of claim 1, wherein a chamber pressure is maintained at a level resulting in viscous flow between the substrate and the cooling surface in the cooling position.

14. The method of claim 1, wherein the substrate remains supported upon the substrate support structure in each of the treatment and cooling positions.

15. The method of claim 1, further comprising rotating the substrate in the cooling position.

16. The method of claim 1, wherein the support structure comprises a susceptor.

17. A method for cooling a substrate after treating the substrate at at least one processing temperature while supported at a first position in a processing chamber, the method comprising moving the substrate from the first position to a second position within the processing chamber proximate a cold element, maintaining the substrate at the second position, and transferring heat from the substrate to the cold element until the substrate reaches a handling temperature lower than the processing temperature.

18. The method of claim 17, wherein the cold element comprises a cold wall of the processing chamber, the wall comprising a material substantially transparent to radiant heat.

19. The method of claim 18, wherein the wall is actively cooled by forced convection.

20. The method of claim 18, wherein the substrate has a surface, the cold wall has a flat inner surface, and the surfaces are positioned facing and substantially parallel to each other in the second position.

21. The method of claim 20, wherein the upper surface of the substrate and the inner surface of the cold wall are substantially horizontal in each of the first and second positions.

22. The method of claim 17, wherein adjacent surfaces of the substrate and the cold element are spaced apart by between about 0.2 mm and 3 mm in the second position.

23. The method of claim 17, wherein adjacent surfaces of the substrate and the cold element are spaced apart by between about 0.5 mm and 1.5 mm in the second position.

24. The method of claim 17, wherein the processing temperature is between about 1,000° C. and 1,200° C., the handling temperature is less than about 900° C., and the substrate is maintained at the second position for less than about 60 seconds.

25. The method of claim 24, wherein the substrate is maintained at the second position for less than about 10 seconds.

26. The method of claim 17, wherein the processing temperature is between about 600° C. and 1,200° C., the handling temperature is less than about 600° C., and the substrated is maintained at the second position for less than about 60 seconds.

27. The method of claim 26, wherein the substrate is maintained at the second position for less than about 10 seconds.

28. The method of claim 17, wherein the substrate is supported by a substrate support structure in each of the first and second positions, and moving the substrate comprises moving the substrate support structure.

29. The method of claim 17, wherein the substrate support structure comprises a susceptor supported by a shaft, and moving the substrate support structure comprises vertically extending the shaft upward toward the cold element.

30. A method of cooling a semiconductor substrate from a first temperature to a second temperature within a processing chamber, the method comprising:

moving a cooling member from a retracted position to a location adjacent and spaced from the substrate, the cooling member having a third temperature in the retracted position, the third temperature lower than the second temperature; and maintaining the cooling member adjacent and spaced from the substrate until the substrate cools to the second temperature; and lifting the substrate with a substrate handling device after the substrate cools to the second temperature.

31. The method of claim 30, wherein the cooling member is within an actively cooled structure at the retracted position.

32. The method of claim 30, further comprising withdrawing the cooling member from the location adjacent the substrate to the retracted position after the substrate cools to the second temperature.

33. The method of claim 30, wherein moving the cooling member comprises horizontally translating the cooling member to the location adjacent the substrate, the cooling member having a cooling surface substantially parallel and vertically spaced from an upper surface of the substrate.

34. The method of claim 33, wherein the upper surface of the substrate is spaced by between about 0.5 mm and 1.5 mm from the cooling surface of the cooling member.

35. The method of claim 33, wherein the cooling member is sheltered within the processing chamber from a heat source at the retracted position.

36. A method of cooling a semiconductor substrate from a first temperature to a second temperature within a chamber, the method comprising:

moving a cooling member from a retracted position to a location adjacent and spaced from the substrate, the cooling member having a third temperature in the retracted position, the third temperature lower than the second temperature; and maintaining the cooling member adjacent and spaced from the substrate until the substrate cools to the second temperature;

lifting the substrate with a substrate handling device after the substrate cools to the second temperature; and moving a second cooling member to a position adjacent and spaced from the substrate on an opposite side of the substrate from the cooling member, and simultaneously transferring heat from the substrate to each of the cooling member and the second cooling member.

37. The method of claim 36, wherein the second cooling member comprises a movable platform beneath a wafer supported on pins.

38. The method of claim 36, wherein the chamber comprises a cooling chamber adjacent a substrate processing chamber.

* * * * *